US009130000B2

(12) United States Patent
Tsuno et al.

(10) Patent No.: US 9,130,000 B2
(45) Date of Patent: Sep. 8, 2015

(54) WAFER BONDING DEVICE AND WAFER BONDING METHOD

(75) Inventors: Takeshi Tsuno, Kanagawa (JP); Takayuki Goto, Kanagawa (JP); Masato Kinouchi, Kanagawa (JP); Kensuke Ide, Shiga (JP); Takenori Suzuki, Shiga (JP)

(73) Assignee: MITSUBISHI HEAVY INDUSTRIES, Tokyo (JP)

( * ) Notice: Subject to any disclaimer, the term of this patent is extended or adjusted under 35 U.S.C. 154(b) by 426 days.

(21) Appl. No.: 13/121,584

(22) PCT Filed: Feb. 19, 2009

(86) PCT No.: PCT/JP2009/052934
§ 371 (c)(1),
(2), (4) Date: May 5, 2011

(87) PCT Pub. No.: WO2010/038487
PCT Pub. Date: Apr. 8, 2010

(65) Prior Publication Data
US 2011/0207291 A1     Aug. 25, 2011

(30) Foreign Application Priority Data

Sep. 30, 2008  (JP) ................................. 2008-255406

(51) Int. Cl.
*H01L 21/30*       (2006.01)
*H01L 21/67*       (2006.01)
(Continued)

(52) U.S. Cl.
CPC .......... *H01L 21/67092* (2013.01); *B23K 17/00* (2013.01); *B23K 37/047* (2013.01);
(Continued)

(58) Field of Classification Search
CPC ................ H01L 21/67092; H01L 21/6833; B29C 65/7897
USPC ....................... 65/152; 156/351; 438/455, 459
See application file for complete search history.

(56) References Cited

U.S. PATENT DOCUMENTS 6,628,500 B1 *  9/2003  Thomas et al. ............... 361/234
6,897,945 B1 *  5/2005  Ottens et al. .................... 355/72
(Continued)

FOREIGN PATENT DOCUMENTS

JP   60-150632 A    8/1985
JP   62-18727 A     1/1987
(Continued)

OTHER PUBLICATIONS

Taiwanese Office Action for corresponding application No. 098105548 mailed Jul. 27, 2012 (with English translation).
(Continued)

*Primary Examiner* — Thao X Le
*Assistant Examiner* — Laura Dykes
(74) *Attorney, Agent, or Firm* — Birch, Stewart, Kolasch & Birch, LLP

(57) ABSTRACT

A wafer bonding method includes: holding a first substrate with an upper holding mechanism 7 by applying a voltage to the upper holding mechanism 7; generating a bonded substrate by bonding the first substrate and a second substrate held with a lower holding mechanism 8; and dechucking the bonded substrate from the upper holding mechanism 7 after a voltage which attenuates while alternating is applied to the upper holding mechanism 7. By applying the voltage which attenuates while alternating to the upper holding mechanism 7, residual attracting force between the bonded substrate and the upper holding mechanism 7 is reduced, thereby enabling the bonded substrate to be dechucked from the holding mechanism more surely in a shorter time period. As a result, the first substrate and the second substrate can be bonded in a shorter time period.

8 Claims, 9 Drawing Sheets

(51) Int. Cl.
  *B29C 65/78* (2006.01)
  *H01L 21/683* (2006.01)
  *B23K 17/00* (2006.01)
  *B23K 37/04* (2006.01)
  *B23K 37/047* (2006.01)
  *H01L 21/18* (2006.01)

(52) U.S. Cl.
  CPC ......... *B23K37/0408* (2013.01); *B29C 65/7897* (2013.01); *H01L 21/6833* (2013.01); *B23K 2201/40* (2013.01); *H01L 21/187* (2013.01)

(56) References Cited

U.S. PATENT DOCUMENTS

| | | | |
|---|---|---|---|
| 2002/0001920 A1* | 1/2002 | Takisawa et al. | 438/455 |
| 2004/0009649 A1* | 1/2004 | Kub et al. | 438/459 |
| 2004/0095546 A1* | 5/2004 | Lee et al. | 349/187 |
| 2005/0231886 A1* | 10/2005 | Chiang et al. | 361/234 |
| 2008/0139074 A1* | 6/2008 | Choi et al. | 445/25 |
| 2008/0314733 A1* | 12/2008 | Cho et al. | 204/164 |
| 2010/0261332 A1* | 10/2010 | Kim et al. | 438/455 |

FOREIGN PATENT DOCUMENTS

| | | | | |
|---|---|---|---|---|
| JP | 62-44332 | A | | 2/1987 |
| JP | 62-71215 | A | | 4/1987 |
| JP | 62-277234 | A | | 12/1987 |
| JP | 1-112745 | A | | 5/1989 |
| JP | 4-359539 | A | | 12/1992 |
| JP | 04359539 | A | * | 12/1992 ............. H01L 21/68 |
| JP | 5-28773 | Y2 | | 7/1993 |
| JP | 2590571 | B2 | | 3/1997 |
| JP | 10-270539 | A | | 10/1998 |
| JP | 10-284583 | A | | 10/1998 |
| JP | 10284583 | A | * | 10/1998 ............. H01L 21/68 |
| JP | 2974303 | B2 | | 11/1999 |
| JP | 2002-231800 | A | | 8/2002 |
| JP | 2003-504871 | A | | 2/2003 |
| JP | 2005-183959 | A | | 7/2005 |
| JP | 2005-191338 | A | | 7/2005 |
| JP | 2005-302858 | A | | 10/2005 |
| JP | 2006-49356 | A | | 2/2006 |
| JP | 3758979 | B2 | | 3/2006 |
| JP | 3810300 | A | | 8/2006 |
| JP | 2007-214287 | A | | 8/2007 |
| JP | 3970304 | B1 | | 9/2007 |
| JP | 2007-266058 | A | | 10/2007 |
| JP | 2007-311462 | A | | 11/2007 |
| JP | 2008-47564 | A | | 2/2008 |
| JP | 2008-159692 | A | | 7/2008 |
| KR | 10-2004-0063190 | A | | 7/2004 |
| KR | 10-2006-0049044 | A | | 5/2006 |
| TW | 1248562 | B | | 2/2006 |
| TW | I248562 | B | | 2/2006 |

OTHER PUBLICATIONS

International Search Report mailed May 26, 2009 for Intl. Appln. No. PCT/JP2009/052934.
Japanese Office Action mailed Apr. 28, 2011 with partial English translation.
Korean Office Action for corresponding Korean Application No. 2011-7007262 mailed Oct. 4, 2012 with English translation.
Decision to Grant a Patent dated May 29, 2014 of corresponding CN Application No. 200980135284.2 with an English translation.
Allowance dated Mar. 26, 2015 issued in corresponding Canadian Application No. 2,739,239.

* cited by examiner

WAFER BONDING DEVICE AND WAFER BONDING METHOD

TECHNICAL FIELD

The present invention relates to a wafer bonding device and a wafer bonding method, and more particularly relates to a wafer bonding device and a wafer bonding method for bonding substrates.

BACKGROUND ART

MEMS (Micro Electro Mechanical Systems), in which minute electric parts and machine parts are integrated, are known. The MEMS are exemplified by a micromachine, a pressure sensor, and a microminiature motor. In the MEMS, a vibrating structure like a cantilever is encapsulated. The MEMS are manufactured by bonding substrates onto which patterns are formed.

Japanese patent JP3970304B discloses a room-temperature bonding device for manufacturing products in large quantities by using room-temperature bonding. The room-temperature bonding device includes: a bonding chamber which generates a vacuum environment for bonding an upper substrate and a lower substrate through room-temperature bonding; an upper stage which is provided inside the bonding chamber and supports the upper substrate in the vacuum environment; a carriage which is provided in the bonding chamber and supports the lower substrate in the vacuum environment; an elastic guide bonded together to the carriage; a positioning stage which is provided inside the bonding chamber and supports the elastic guide so as to be movable in a horizontal direction; a first mechanism which drives the elastic guide to move the carriage in the horizontal direction; a second mechanism which moves the upper stage in upper and lower directions perpendicular to the horizontal direction; and a carriage support which is provided inside the bonding chamber, and supports the carriage in a direction into which the upper stage moves when the lower substrate and the upper substrate are pressure-welded. The elastic guide supports the carriage so that the carriage does not come in contact with the carriage support when the lower substrate and the upper substrate do not come in contact with each other, and is elastically deformed so that the carriage comes in contact with the carriage support when the lower substrate and the upper substrate are pressure-bonded.

In the case of such a room-temperature bonding device, two substrates to be bonded are held by an electrostatic chuck mainly with electrostatic attractive force, and bonded. When products are manufactured in large quantities by using such bonding, it is desired that substrates are bonded as sure as possible in a time period as short as possible.

Japanese patent publication JP-A-Heisei 01-112745 discloses a method in which a processed wafer can be detached surely from an electrostatic chuck easily without damaging the wafer. The method of detaching the wafer in a semiconductor manufacturing device is characterized in that when an applied voltage to the electrostatic chuck of the semiconductor manufacturing device is stopped, the applied voltage is turned off while polarities of the applied voltage are alternated.

Japanese patent publication JP-A-Heisei 10-270539 discloses an electrostatic chuck usage method in which a wafer can easily be detached from an electrostatic chuck and a foreign substance does not adhere to the wafer. The electrostatic chuck usage method, which is a method of using the electrostatic chuck with two electrodes for attracting and detaching the wafer by applying voltage to the electrodes, is characterized in that voltage is applied to the two electrodes so that a potential difference is caused between the two electrodes and so that potential of the wafer has the polarity opposite to the polarity of charges of the wafer, when the wafer is detached from the electrostatic chuck.

Japanese patent publication JP-A-Heisei 10-284583 discloses an electrostatic-chuck static eliminating method which can surely detach a semiconductor wafer. The electrostatic-chuck static eliminating method having an electrostatic chuck which includes a dielectric capable of attracting and detaching the semiconductor wafer by performing charge or discharge of the semiconductor wafer in accordance with an applied voltage of one electrode of a pair of electrodes positioned opposite to each other in a chamber, is characterized in that the applied voltage forms a unipolar attenuated rectangular wave which includes positive or negative voltage, when the semiconductor wafer is detached from the electrostatic chuck.

Japanese patent JP1645440B discloses a detaching device for an object to be processed, for surely detaching an object to be processed fixed by an electrostatic chuck. The detaching device for an object to be processed is characterized in that: a hole, which penetrates an electrode of an electrostatic chuck for electrostatically fixing an object to be processed and a dielectric layer attached to an object fixing side face of the electrode, is provided at a fixing position of the object; a gas supply tube and a gas exhaust tube are connected to the hole; and gas sent from the gas supply tube is sprayed from the hole to a fixing face of the object fixed to the electrostatic chuck, in order to discharge charges accumulated to the dielectric layer thereby detaching the object.

Japanese patent publication JP-A-Showa 62-18727 discloses a semiconductor processing device having an electrostatic chuck mechanism capable of more surely fixing an object to be processed to an electrostatic chuck and surely detaching the object to be processed. The semiconductor processing device having: a conductive chamber of which upper portion is open; an electrostatic chuck electrode provided to the upper portion of the chamber through insulating material; a dielectric film provided to a face of the electrostatic chuck on the side attaching to the insulating material; a hole which is made by penetrating the dielectric film and the electrostatic chuck electrode and through which supply and evacuation of gas are performed; and a support which moves upward an object to be processed placed in the chamber, is characterized in that a cylindrical insulating member is embedded at least in a hole portion extending over the electrostatic chuck electrode and the dielectric film.

Japanese patent publication JP-A-Showa 62-277234 discloses an electrostatic chuck device which can make forcible detachment force opposed to residual attracting force act on an object to be attracted so that detachment of the object from an attracting face is immediately possible when the object to be attracted such as a wafer needs to be detached, and which can easily exchange electrodes in a case of damage of an attracting face. The electrostatic chuck device is characterized in that the electrostatic chuck device has an electrostatic attraction substrate having a gas ejecting means which ejects pressurized gas between a portion to be attracted and an attracting face in order to detach an object to be attracted.

Japanese patent JP 2590571B discloses a reliable wafer holding mechanism of a semiconductor wafer processing device, capable of forcibly detaching a wafer from an electrostatic chuck while keeping a stable position and while keeping a blow gas pressure low. The wafer holding mechanism of the semiconductor wafer processing device, for fitting an electrostatic chuck at the tip of a chuck holder provided in a process treatment chamber and attracting and holding a semiconductor wafer carried into the chamber with the electrostatic chuck in order to perform given process treatment, is characterized in that the wafer holding mechanism includes: an electrostatic chuck which has a ring-shaped gas ejecting groove formed on a chuck face of the chuck body and a gas introducing hole provided to the chuck body in communication with the gas ejecting groove; and a blow gas supplying means which is connected through pipe connection to a guide introducing hole of the electrostatic chuck through the inside of the chuck holder, and characterized in that blow gas supplied from the blow gas supplying means is introduced to the whole circumference of the gas ejecting groove after voltage application to the electrostatic chuck is stopped while the wafer is attracted and held, in order to forcibly detach the wafer from the chuck face of the electrostatic chuck with the blow gas pressure.

Japanese Patent JP2974303B discloses a productive, reliable, and low-cost detachment method for an object to be processed. The detachment method for an object to be processed is characterized in that at least one of water, alcohol and mixed gas including water or alcohol is introduced to space between an electrostatic chuck and an object to be processed after the object is held by the electrostatic chuck and the object is processed, in order to detach the object from the electrostatic chuck.

Japanese patent publication JP-P2002-231800A discloses a substrate processing method which prevents a plasma-treated substrate from being attracted to an upper electrode and improves an yield and an operation rate. The substrate processing method, when plasma is generated between an upper electrode and a lower electrode positioned opposite to each other to perform plasma processing to a substrate placed on the lower electrode and take out the processed substrate, prevents adhesion of the substrate to the upper electrode due to residual charges by spraying gas flowing from the side of the upper electrode toward the side of the lower electrode to the processed substrate.

Japanese patent JP3758979B discloses an electrostatic chuck with high detachment responsiveness and with less gas leakage while keeping substrate heat uniformity and high attracting force. The electrostatic chuck, which includes a ceramic dielectric layer, a placing face which is provided on the surface of the ceramic dielectric layer and holds an object to be held, and a hold electrode provided to face the face opposite to the placing face, is characterized in that the placing face is separated into a placing face outer-circumferential region and a placing face central region by a gas ejecting groove, and surface roughness Ra is 0.6 μm to 1.5 μm in the placing face central region and 0.7 μm or below in the placing face outer-circumferential region, and characterized in that the surface roughness of the placing face outer-circumferential region is smaller than the surface roughness of the placing face central region, and the height of the placing face outer-circumferential region is higher than the height of the placing face central region by 0.6 μm to 10 μm.

Japanese patent JP3810300B discloses an electrostatic chuck, which firmly attracts even a wafer with a warpage and a deformation to make a uniform temperature distribution of a wafer surface, which has less leakage of cooling gas, and which shows excellent wafer detachment responsiveness. The electrostatic chuck includes: a concave portion with a depth of 3 μm to 10 μm, where a bottom face of a central region excluding a peripheral portion is a first holding face serving as a wafer attracting region in one principal face of a plate-shaped ceramic body while excluding an outer circumferential region with a top face serving as a second wafer holding face; a gas groove in the peripheral portion of the bottom face of the concave portion; and an electrode for electrostatic attraction provided in the plate-shaped ceramic body located inward than the second holding face or on the other principal face of the plate-shaped ceramic body, on the lower side of the first holding face. The electrostatic chuck is characterized in that undulation of the second holding face is 1 μm to 3 μm.

Japanese patent publication JP-P2003-504871T discloses an electrostatic chuck which prevents a warpage of a ceramic layer and leakage of cooling gas, and which increases electrostatic attractive force while requiring less time for detachment. The electrostatic chuck is characterized in that the electrostatic chuck includes: a metallic substrate; a disk-shaped ceramic layer which has a given thickness and adheres to the metallic substrate through an adhesive layer; a plane electrode embedded in the ceramic layer at the center of a thickness direction of the ceramic layer; and a cooling gas groove formed on the surface of the ceramic layer at an upper portion of the electrode inwardly than the outer end.

Japanese patent publication JP-P2005-191338A discloses a substrate holding device which can fix such a substrate as a wafer with high precision and which can reduce damage to a substrate at the time of detachment of the substrate. The substrate holding device including: a first fixing member which depressurizes a hollow portion and can attract and hold at least an outer circumferential region of a substrate to a first holding face; a second fixing member which is provided in the hollow portion and which can attract and hold a substrate to a second holding face by depressurizing an attracting aperture; a member lifting and lowering device for lifting and lowering at least either the first fixing member or the second fixing member and changing upper and lower positions of the first holding face and the second holding face; and an attracting unit which is connected to the hollow portion of the first fixing member and the attracting aperture of the second fixing member and which can attract and release a substrate to and from at least either the first holding face or the second holding face, is characterized in that attraction to and release from the first fixing member and the second fixing member are independently controlled by the attraction unit, and in that a substrate is abutted against and detached from the first holding face and the second holding face by the member lifting and lowering device.

Japanese patent publication JP-P2006-49356A discloses an electrostatic chuck which can maintain a smooth face even after exposure to plasma, to make it possible to prevent particle contamination on such an object to be attracted as a silicon wafer while having excellent attraction and detachment characteristics for an object to be attracted. The electrostatic chuck is characterized in that the electrostatic chuck has a dielectric for an electrostatic chuck characterized in that alumina is 99.4 wt % or above, titanium oxide is greater than 0.2 wt % and equal to or smaller than 0.6 wt %, an average particle diameter is 2 μm or less and a volume resistivity is $10^8$ to $10^{11}$ Ωcm at room temperature, and the electrostatic chuck is used at low temperature of 100 degrees Celsius or less.

Japanese patent publication JP-P2007-214287A discloses an electrostatic chuck which can easily be made by low-temperature firing and which can maintain a smooth face even after exposure to plasma, to make it possible to prevent particle contamination on such an object to be attracted as a silicon wafer while having excellent attraction and detachment characteristics for an object to be attracted. The electrostatic chuck is characterized in that the electrostatic chuck has a dielectric for an electrostatic chuck where alumina is 99.4 wt % or above, titanium oxide is greater than 0.2 wt % and equal to or less than 0.6 wt %, a volume resistivity is $10^8$ to $10^{11}$ Ωcm at room temperature, and titanium oxide is segregated in a grain boundary of alumina particles.

Japanese patent publication JP-P2007-311462A discloses an electrostatic chuck table mechanism having a function of removing static electricity on a protection tape attached to an object to be processed. The electrostatic chuck table mechanism, which includes: a chuck table with a holding face for holding an object to be processed; an electrode which is provided in the chuck table and generates charges as a result of voltage application; and a voltage applying means for applying a voltage to the electrode, is characterized in that the electrostatic chuck table mechanism includes an air supplying passage which is formed to the chuck table and opens at the holding face, and an ionized air supplying means for supplying ionized air to the air supplying passage.

Japanese patent publication JP-P2008-47564A discloses a vacuum processing device which can examine an insulation state of a dielectric layer before the start of use of an electrostatic chuck in performing vacuum processing for a substrate and the like. The vacuum processing device, which places a substrate on an electrostatic chuck provided to a placing board in a vacuum container and electrostatically attracts the substrate to the electrostatic chuck by applying a chuck voltage to a chuck electrode, to perform processing of the substrate, is characterized in that the vacuum processing device includes: a power source for applying an examining voltage lower than a chuck voltage at the time of vacuum processing to the chuck electrode; a measurement section for measuring electrical characteristics of the electrostatic chuck when the examining voltage is applied to the chuck electrode and acquiring measured data; and an examination section for examining whether the electrostatic chuck can be used or not based on the measured data acquired from the measurement section and the preliminarily-set setting data.

The technique disclosed in the above-mentioned related art documents for detaching a substrate from an electrostatic chuck more surely, is not applied to technique for bonding substrates.

SUMMARY OF INVENTION

An object of the present invention is to provide a wafer bonding device and a wafer bonding method which bond substrates in a shorter period of time.

Another object of the present invention is to provide a wafer bonding device and a wafer bonding method which detach a substrate from a holding mechanism more surely.

Still another object of the present invention is to provide a wafer bonding device and a wafer bonding method which prevent deterioration of an environment where substrates are bonded.

A wafer bonding method according to the present invention includes: holding a first substrate with a holding mechanism by applying a voltage to the holding mechanism; generating a bonded substrate by bonding the first substrate and a second substrate; and dechucking the bonded substrate from the holding mechanism after a voltage which attenuates while alternating is applied to the holding mechanism. As a result of the application of the voltage which attenuates while alternating to the holding mechanism, residual attracting force between the bonded substrate and the holding mechanism is reduced and the bonded substrate can be dechucked from the holding mechanism more surely.

The wafer bonding method according to the present invention further includes supplying gas between the bonded substrate and the holding mechanism. According to the wafer bonding method, the bonded substrate can be dechucked even when the bonded substrate cannot be dechucked only by applying the voltage which attenuates while alternating to the holding mechanism.

It is preferable that the gas is supplied between the bonded substrate and the holding mechanism when another holding mechanism, which was held the second substrate, is detached from the bonded substrate.

The bonded substrate, when dechucked from the holding mechanism, moves so that the bonded substrate is held by the other holding mechanism with gravity applied to the bonded substrate. That is to say, the wafer bonding method according to the present invention is preferable when the bonded substrate is held on the vertically lower side of the holding mechanism.

The wafer bonding method according to the present invention further includes: detecting whether the bonded substrate is dechucked from the holding mechanism; and supplying gas with a pressure greater than a pressure of the gas between the bonded substrate and the holding mechanism when the bonded substrate is not dechucked from the holding mechanism. At this time, the gas is prevented from being excessively used.

The wafer bonding method according to the present invention further includes: separating the holding mechanism and the other holding mechanism when the other holding mechanism holds the bonded substrate, i.e. after the bonded substrate is dechucked from the holding mechanism; and carrying the bonded substrate after the holding mechanism and the other holding mechanism are separated.

The wafer bonding method according to the present invention further includes: holding a third substrate different from the first substrate with the holding mechanism, generating another bonded substrate by bonding the third substrate and a forth substrate, and supplying gas with the pressure of the gas supplied between the holding mechanism and the bonded substrate when the bonded substrate is dechucked from the holding mechanism after a voltage which attenuates while alternating is applied to the holding mechanism, between the other bonded substrate and the holding mechanism. At this time, operation of bonding the third substrate and the fourth substrate can be performed in a shorter period of time compared with operation of bonding the first substrate and the second substrate.

It is preferable that the wafer bonding method according to the present invention further includes: calculating attracting force with which the holding mechanism holds the bonded substrate, based on the pressure of the gas supplied between the holding mechanism and the bonded substrate when the bonded substrate is dechucked from the holding mechanism.

The wafer bonding method according to the present invention further includes: grounding the bonded substrate after the voltage which attenuates while alternating is applied to the holding mechanism.

The wafer bonding method according to the present invention further includes: cleaning the first substrate and the second substrate before the first substrate and the second substrate are bonded. That is to say, it is preferable that the wafer bonding method according to the present invention is applied to bonding of the first substrate and the second substrate through room-temperature bonding.

The wafer bonding device according to the present invention includes: a holding mechanism configured to include an electrode, a driving mechanism configured to drive the holding mechanism for a second substrate so that a first substrate held by the holding mechanism is bonded to the second substrate, and a power supply unit. The power supply unit has: a substrate holding mode for applying a voltage to the electrode so that the holding mechanism holds the first substrate, and an alternating and attenuating mode for applying a voltage which attenuates while alternating to the electrode. Residual attracting force between the bonded substrate and the holding mechanism is reduced as a result of the application of the voltage which attenuates while alternating to the holding mechanism, and the bonded substrate can be dechucked from the holding mechanism more surely.

The wafer bonding device according to the present invention further includes: a gas dechuck unit configured to supply gas. The holding mechanism is provided with an attracting face which comes in contact with the first substrate, and a flow passage through which the gas is supplied from the gas dechuck unit to the attracting face. The wafer bonding device can dechuck the bonded substrate even when the bonded substrate cannot be dechucked only by applying the voltage which attenuates while alternating to the holding mechanism.

It is preferable that the wafer bonding device according to the present invention further includes: a sensor configured to detect whether a substrate is held by the holding mechanism.

The gas dechuck unit supplies the gas with any pressure. At this time, the wafer bonding device, when the bonded substrate cannot be dechucked from the holding mechanism by supplying the gas, can perform operation of supplying gas between the bonded substrate and the holding mechanism with a pressure greater than the pressure of the gas, and the gas is prevented from being excessively used.

It is preferable that the wafer bonding device according to the present invention further includes: a mechanism configured to ground a substrate held by the holding mechanism.

The wafer bonding device according to the present invention further includes a cleaning unit configured to clean the first substrate and the second substrate. That is to say, it is preferable that the wafer bonding device according to the present invention is applied to bonding of the first substrate and the second substrate through room-temperature bonding.

BRIEF DESCRIPTION OF DRAWINGS

FIG. 6 shows a state of a wafer bonding device when a substrate is carried in;

DESCRIPTION OF EMBODIMENTS

Figure 1:
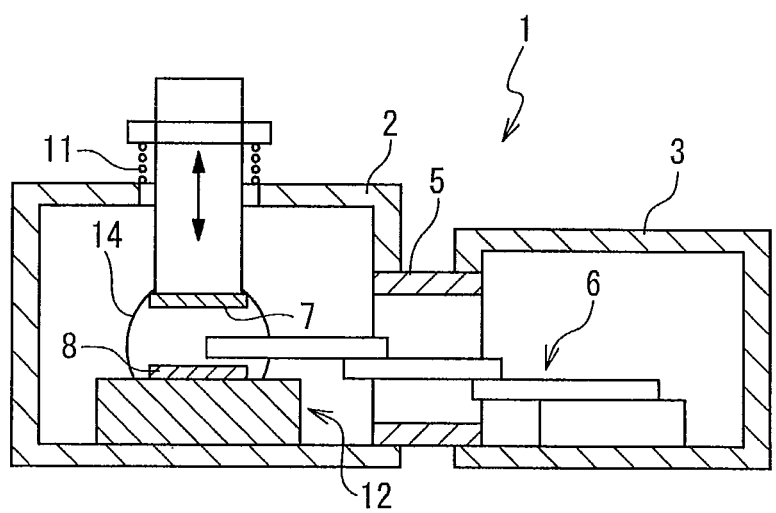
FIG. 1 is a sectional view showing a wafer bonding device according to an embodiment of the present invention.

An embodiment of a wafer bonding device according to the present invention will be described below with reference to the drawings. A wafer bonding device 1 includes: a bonding chamber 2 and a load lock chamber 3, as shown in FIG. 1. The bonding chamber 2 and the load lock chamber 3 are containers which are sealed up so that the respective inside are separated from the environment. The wafer bonding device 1 further includes agate valve 5. The gate valve 5, which is provided between the bonding chamber 2 and the load lock chamber 3, closes and opens a gate for connecting the inside of the bonding chamber 2 and the inside of the load lock chamber 3.

The load lock chamber 3 includes a lid and a vacuum pump (not shown). The lid closes and opens a gate for connecting the outside and the inside of the load lock chamber 3. The vacuum pump discharges gas from the inside of the load lock chamber 3. The vacuum pump is exemplified by a turbo-molecular pump, a cryopump, and an oil diffusion pump.

The load lock chamber 3 further includes a carrier unit 6 inside. The carrier unit 6 carries a substrate provided inside the load lock chamber 3 to the bonding chamber 2 through the gate valve 5, and carries a substrate provided inside the bonding chamber 2 to the load lock chamber 3 through the gate valve 5.

The bonding chamber 2 includes an upper holding mechanism 7, a lower holding mechanism 8, a pressure bonding mechanism 11, and an alignment mechanism 12. The lower holding mechanism 8, which is provided inside the bonding chamber 2, is supported by the bonding chamber 2 so that the lower holding mechanism 8 can move parallel in a horizontal direction and so that the lower holding mechanism 8 can rotate around a rotational axis parallel to a vertical direction. The lower holding mechanism 8 is used to hold a substrate. The alignment mechanism 12 drives the lower holding mechanism 8 so that a substrate supported by the lower holding mechanism 8 moves parallel in a horizontal direction or rotates around a rotational axis parallel to a vertical direction. The upper holding mechanism 7, which is provided inside the bonding chamber 2, is supported by the bonding chamber 2 so that the upper holding mechanism 7 can move parallel in a vertical direction. The upper holding mechanism 7 is used to hold a substrate. The pressure bonding mechanism 11 drives the upper holding mechanism 7 so that a substrate supported by the upper holding mechanism 7 moves parallel in a vertical direction.

The bonding chamber 2 further includes an ion gun 14. The ion gun 14 accelerates and emits argon ions. The ion gun 14, when a substrate supported by the upper holding mechanism 7 and a substrate supported by the lower holding mechanism 8 are separated from each other, is directed toward space between the substrate supported by the upper holding mechanism 7 and the substrate supported by the lower holding mechanism 8, and directed toward the inner surface of the bonding chamber 2. That is to say, an emitting direction of the ion gun 14 intersects with the inner surface of the bonding chamber 2, through the space between the substrate supported by the upper holding mechanism 7 and the substrate supported by the lower holding mechanism 8. Note that the ion gun 14 can be replaced by another cleaning unit for cleaning a substrate surface. A cleaning unit is exemplified by a plasma gun and a fast atomic beam source.

Figure 2:
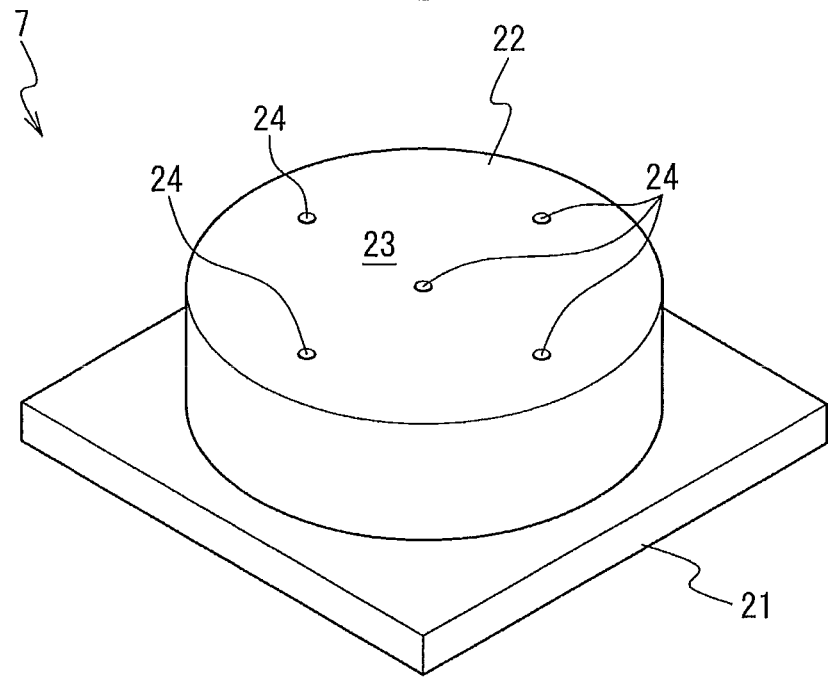
FIG. 2 is a perspective view showing an upper holding mechanism.

FIG. 2 shows the upper holding mechanism 7. The upper holding mechanism 7 includes a base material 21 and an electrostatic chuck 22. The base material 21 is a part driven by the pressure bonding mechanism 11. The electrostatic chuck 22 is made of ceramics in the form of a cylinder. One bottom surface of the cylinder as the electrostatic chuck 22 is bonded to the base material 21 and fixed to the base material 21. The electrostatic chuck 22 has an attracting face 23 and gas holes 24. The attracting face 23, which is the other bottom surface of the cylinder, is formed flat and smooth. The gas holes 24 are formed to the attracting face 23.

Figure 3:
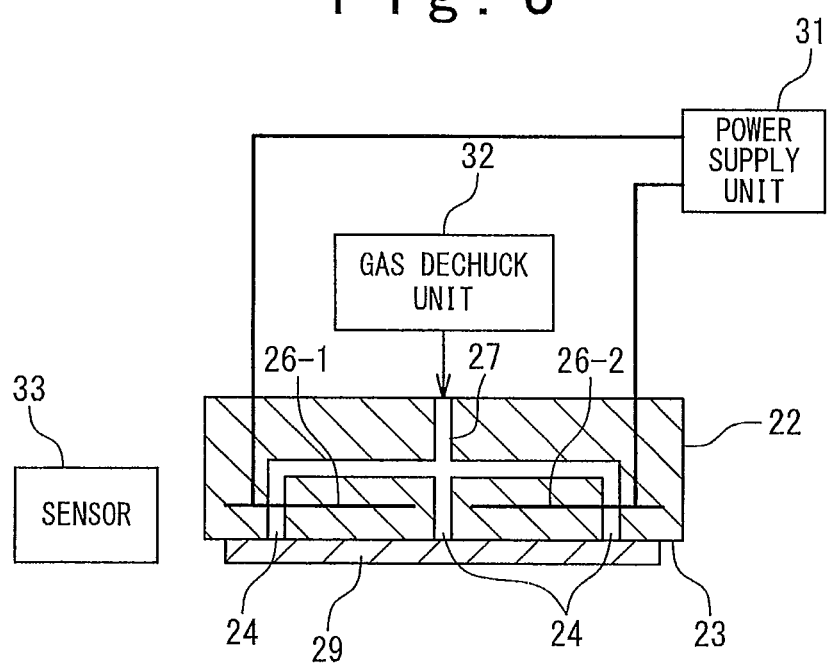
FIG. 3 is a sectional view showing an electrostatic chuck.

FIG. 3 shows the electrostatic chuck 22. The electrostatic chuck 22 includes electrodes 26-1 and 26-2, and a gas flow passage 27. The electrodes 26-1 and 26-2 are made of conductors and embedded in the electrostatic chuck 22. The gas flow passage 27 is embedded in the electrostatic chuck 22, and one ends of the gas flow passage 27 are connected to the gas holes 24.

The wafer bonding device 1 further includes a power supply unit 31, a gas dechuck unit 32, and a sensor 33. The power supply unit 31 applies voltages to the electrodes 26-1 and 26-2, and grounds the electrodes 26-1 and 26-2. The power supply unit 31 is used to hold a substrate 29 with the electrostatic chuck 22 so that the substrate 29, which is in contact with the attracting face 23 of the electrostatic chuck 22, does not fall due to gravity, and is used to detach the substrate 29 held by the electrostatic chuck 22 from the electrostatic chuck 22. The power supply unit 31 constantly grounds the substrate held by (in contact with) the lower holding mechanism 8, by constantly grounding the lower holding mechanism 8. The gas dechuck unit 32 supplies argon gas of a given pressure to the gas flow passage 27, and stops the supply of the argon gas into the gas flow passage 27. The gas dechuck unit 32 is used to detach the substrate 29 held by the electrostatic chuck 22 from the electrostatic chuck 22. Note that the gas dechuck unit 32 may supply another gas having a small effect, in place of argon gas. The gas is exemplified by nitrogen. The sensor 33, which includes a photodetector, detects whether the substrate 29 is held by the electrostatic chuck 22 by emitting light in the vicinity of the attracting face 23. The sensor 33 maybe replaced by another sensor for detecting whether the substrate 29 is held by the electrostatic chuck 22. The sensor is exemplified by a mechanical sensor for detecting whether the substrate 29 is held by the electrostatic chuck 22 by being deformed when the substrate 29 is held by the electrostatic chuck 22.

Figure 4:
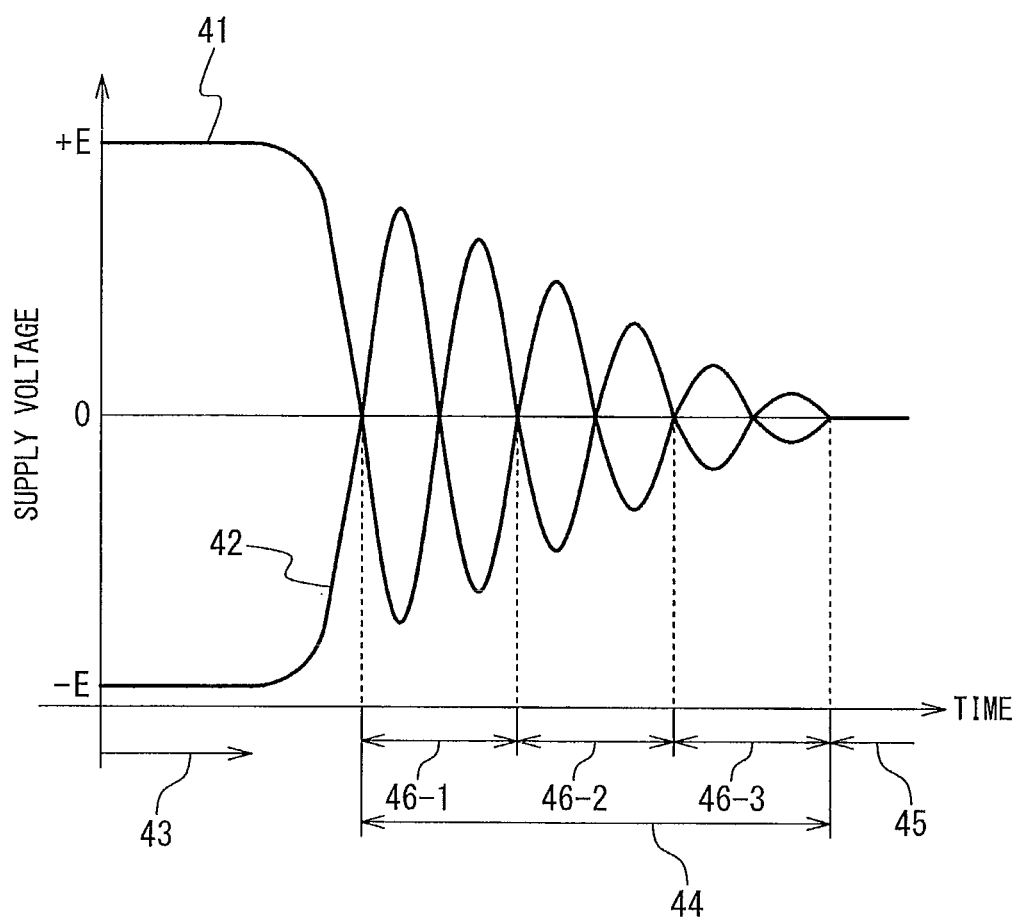
FIG. 4 is a graph showing variations in voltages applied to electrodes.

FIG. 4 shows a variation in a voltage applied to the electrode 26-1 by the power supply unit 31. A variation 41 shows that ways of voltage variations are different among a plurality of sections 43 to 45, and that the power supply unit 31 has a plurality of operation modes. The operation modes include a substrate holding mode, an alternating and attenuating mode, and a grounding mode. The section 43 corresponds to a period when the power supply unit 31 operates in the substrate holding mode. The section 44 corresponds to a period when the power supply unit 31 operates in the alternating and attenuating mode. The section 45 corresponds to a period when the power supply unit 31 operates in the grounding mode. The variation 41 further shows that the operation of the alternating and attenuating mode is performed immediately after the operation of the substrate holding mode. The variation 41 also shows that the operation of the grounding mode is performed immediately after the operation of the alternating and attenuating mode.

The variation 41 shows that a voltage applied to the electrode 26-1 during the section 43 is a voltage +E which is fixed, and shows that the power supply unit 31 applies the fixed voltage +E to the electrode 26-1 in the substrate holding mode. The variation 41 shows that a voltage applied to the electrode 26-1 during the section 45 is a voltage 0 (zero) which is fixed, and shows that the power supply unit 31 grounds the electrode 26-1 in the grounding mode.

The variation 41 shows that a voltage applied to the electrode 26-1 attenuates while alternating during the section 44. The section 44, for example, includes periodic sections 46-1 to 46-3 which are equal to each other. Each length of the periodic sections 46-1 to 46-3 is 2 seconds for example. In each of the periodic sections 46-1 to 46-3, a negative voltage smaller than the ground voltage 0 is applied to the electrode 26-1 after a positive voltage larger than the ground voltage 0 is applied to the electrode 26-1. The ground voltage 0 is coincident with a voltage applied to a substrate held by the lower holding mechanism 8. The largest value of a voltage applied to the electrode 26-1 in the periodic section 46-1 is smaller than the voltage +E, and the smallest value of the voltage applied to the electrode 26-1 in the periodic section 46-1 is larger than a voltage −E. The largest value of a voltage in the periodic section 46-2 is smaller than the largest value of the voltage in the periodic section 46-1, and the smallest value of the voltage in the periodic section 46-2 is larger than the smallest value of the voltage in the periodic section 46-1. The largest value of a voltage in the periodic section 46-3 is smaller than the largest value of the voltage in the periodic section 46-2, and the smallest value of the voltage in the periodic section 46-3 is larger than the smallest value of the voltage in the periodic section 46-2.

Note that the section 44 may also be divided into the n number (n=4, 5, or 6 for example) of periodic sections 46-1 to 46-n different from the three periodic sections 46-1 to 46-3. At this time, the largest value of a voltage in a periodic section 46-i (i=2,3, . . . , n) is smaller than the largest value of a voltage in a periodic section 46-(i−1), and the smallest value of the voltage in the periodic section 46-i is larger than the smallest value of the voltage in the periodic section 46-(i−1).

FIG. 4 further shows a variation in a voltage applied to the electrode 26-2 by the power supply unit 31. A variation 42 shows that the voltage applied to the electrode 26-2 and the voltage applied to the electrode 26-1 are symmetrical with respect to the ground voltage 0. That is to say, the variation 42 shows that a voltage applied to the electrode 26-2 in the section 43 is the voltage −E which is fixed, and that the power supply unit 31 applies the fixed voltage −E to the electrode 26-2 in the substrate holding mode. The change 42 shows that a voltage applied to the electrode 26-2 in the section 45 is the voltage 0 (zero) which is fixed, and that the power supply unit 31 grounds the electrode 26-2 in the grounding mode.

The change 42 shows that a voltage applied to the electrode 26-2 attenuates while alternating during the section 44. The section 44, for example, includes the plurality of the periodic sections 46-1 to 46-3 which are equal to each other. In each of the periodic sections 46-1 to 46-3, a positive voltage larger than a ground voltage is applied to the electrode 26-2 after a negative voltage smaller than the ground voltage is applied to the electrode 26-2. The ground voltage is coincident with a voltage applied to the substrate held by the lower holding mechanism 8. The largest value of a voltage applied to the electrode 26-2 in the periodic section 46-1 is smaller than the voltage +E, and the smallest value of the voltage applied to the electrode 26-2 in the periodic section 46-1 is larger than the voltage −E. The largest value of a voltage in the periodic section 46-2 is smaller than the largest value of the voltage in the periodic section 46-1, and the smallest value of the voltage in the periodic section 46-2 is larger than the smallest value of the voltage in the periodic section 46-1. The largest value of a voltage in the periodic section 46-3 is smaller than the largest value of the voltage in the periodic section 46-2, and the smallest value of the voltage in the periodic section 46-3 is larger than the smallest value of the voltage in the periodic section 46-2.

Figure 5:
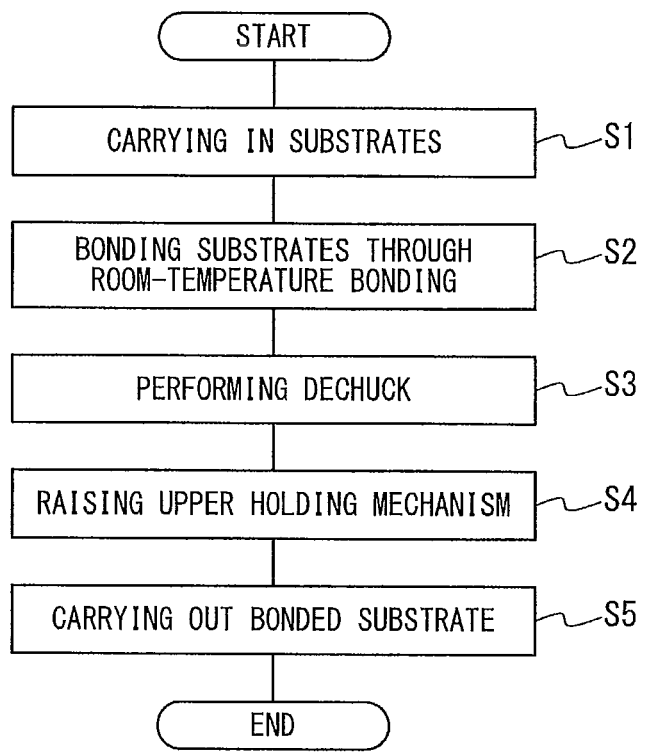
FIG. 5 is a flowchart showing a wafer bonding method according to an embodiment of the present invention.

FIG. 5 shows a wafer bonding method according to an embodiment of the present invention. The wafer bonding method according to the present invention is performed by using the wafer bonding device 1. A user firstly generates a vacuum environment inside the bonding chamber 2 and generates an atmospheric-pressure environment inside the load lock chamber 3 after closing the gate valve 5. The user opens the lid of the load lock chamber 3 and places a plurality of substrates inside the load lock chamber 3. The user closes the lid of the load lock chamber 3 and generates a vacuum atmosphere inside the load lock chamber 3.

Figure 6:
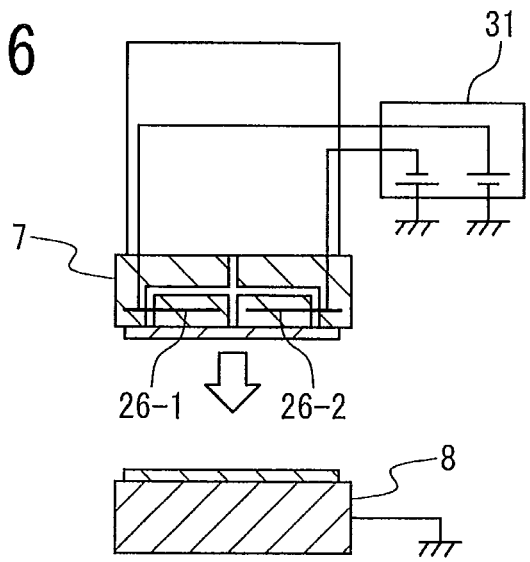

The user, after opening the gate valve 5, sets up one lower substrate of the substrates positioned inside the load lock chamber 3 on the lower holding mechanism 8 and sets up one upper substrate of the substrates positioned inside the load lock chamber 3 on the upper holding mechanism 7 by using the carrier unit 6 as shown in FIG. 6. At this time, when the upper substrate makes contact with the electrostatic chuck 22 of the upper holding mechanism 7, the grounding mode is switched to the substrate holding mode, and the power supply unit 31 applies the voltage +E to the electrode 26-1 and applies the voltage −E to the electrode 26-2. As a result of such voltage application, electrostatic force, with which the electrodes 26-1 and 26-2 and the upper substrate attract each other, is generated, and the electrostatic chuck 22 holds the upper substrate with the electrostatic force so that the upper substrate does not fall from the attracting face 23 of the electrostatic chuck 22 due to gravity (step S1).

The wafer bonding device 1 closes the gate valve 5 after the lower substrate is held by the lower holding mechanism 8 and the upper substrate is held by the upper holding mechanism 7, and bonds the upper substrate and the lower substrate through room-temperature bonding. That is to say, the user firstly generates a vacuum environment at given degree of vacuum in the bonding chamber 2. Under the state where the upper substrate and the lower substrate are apart from each other, the user emits argon ions toward the space between the upper substrate and the lower substrate by using the ion gun 14. The argon ions are emitted toward the upper substrate and the lower substrate, to remove oxide for example caused on the surfaces of the upper substrate and the lower substrate, and remove impurities on the surfaces of the upper substrate and the lower substrate.

The user operates the pressure bonding mechanism 11 to lower the upper holding mechanism 7 in a vertically lower direction and make the upper substrate and the lower substrate come close to each other. The user operates the alignment mechanism 12 to move the position of the lower holding mechanism 8 so that relative positions within horizontal surfaces of the upper substrate and the lower substrate are matched as designed. The user performs control so that the pressure within the bonding chamber 2 is set at a target pressure, while the substrates are aligned.

Figure 7:
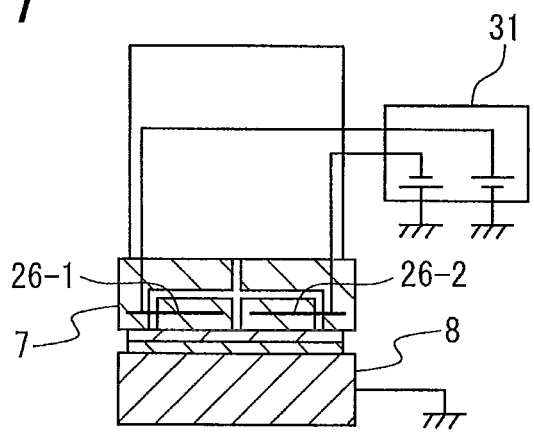
FIG. 7 shows a state of the wafer bonding device at the time of room-temperature bonding.

When the upper substrate and the lower substrate are aligned and the pressure within the bonding chamber 2 is stable at the target pressure, the user operates the pressure bonding mechanism 11 to lower the upper holding mechanism 7 in a vertically lower direction and make the upper substrate and the lower substrate come into contact with each other as shown in FIG. 7. The upper substrate and the lower substrate are bonded as a result of the contact, and formed into a single bonded substrate (step S2).

Figure 9:
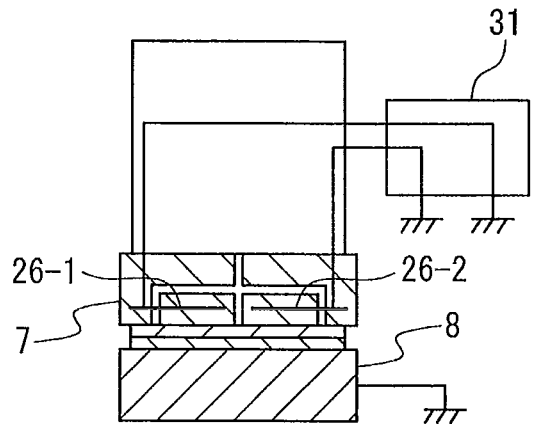
FIG. 9 shows a state of the wafer bonding device at the time of a grounding mode.
Figure 10:
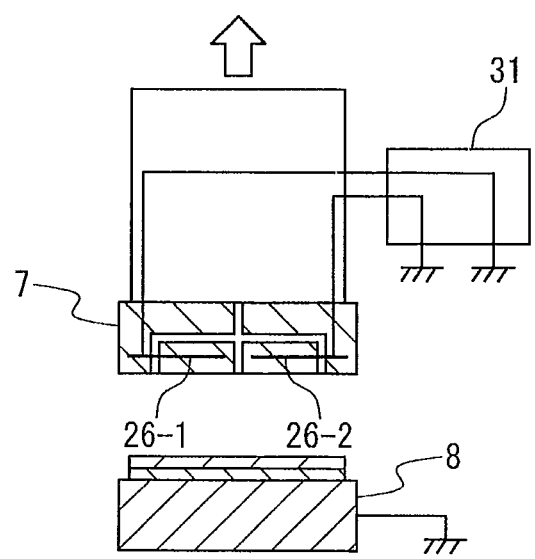
FIG. 10 shows a state of the wafer bonding device when a substrate is carried out.

The user, after the bonded substrate is formed, performs a dechuck sequence to position the bonded substrate to the lower holding mechanism 8 as shown in FIG. 9 (step S3). Next, the user raises the upper holding mechanism 7 in a vertically upward direction by using the pressure bonding mechanism 11 to separate the upper holding mechanism 7 and the lower holding mechanism 8 as shown in FIG. 10 so that the carrier unit 6 can carry the bonded substrate out (step S4). The user, after separating the upper holding mechanism 7 and the lower holding mechanism 8, opens the gate valve 5 and carries the bonded substrate positioned to the lower holding mechanism 8 in the load lock chamber 3 by using the carrier unit 6 (step S5).

The operations from the step S1 to the step S5 are repeated until all of the initially-provided substrates in the load lock chamber 3 are bonded through room-temperature bonding. The user, after all of the initially-provided substrates in the load lock chamber 3 are bonded through room-temperature bonding, closes the gate valve 5 and generates an atmospheric-pressure environment inside the load lock chamber 3. The user opens the lid of the load lock chamber 3 and takes out the bonded substrates bonded through room-temperature bonding from the load lock chamber 3.

In the step S3, either a first dechuck sequence or a second dechuck sequence is performed. For example, the first dechuck sequence is performed immediately after the first room-temperature bonding among a plurality of times of room-temperature bonding performed for the plurality of substrates placed in the load lock chamber 3. The second dechuck sequence is performed immediately after the second room-temperature bonding or thereafter among the plurality of times of room-temperature bonding.

Figure 8:
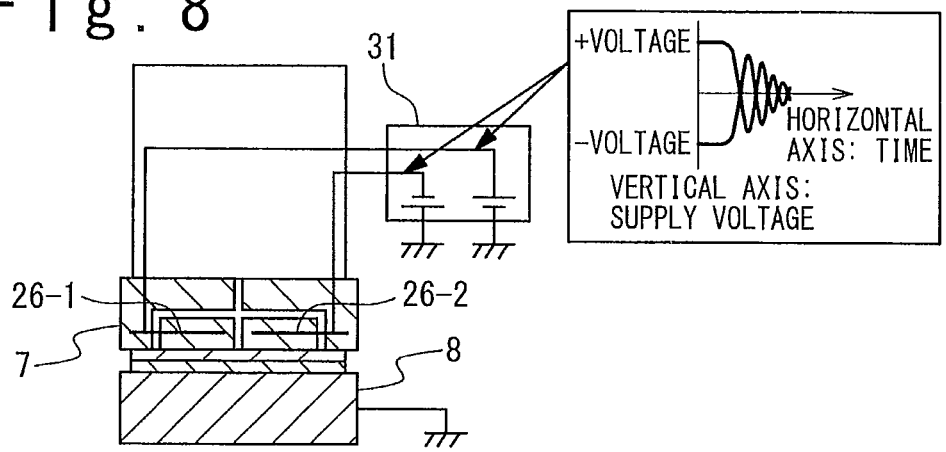
FIG. 8 shows a state of the wafer bonding device at the time of an alternating and attenuating mode.
Figure 11:
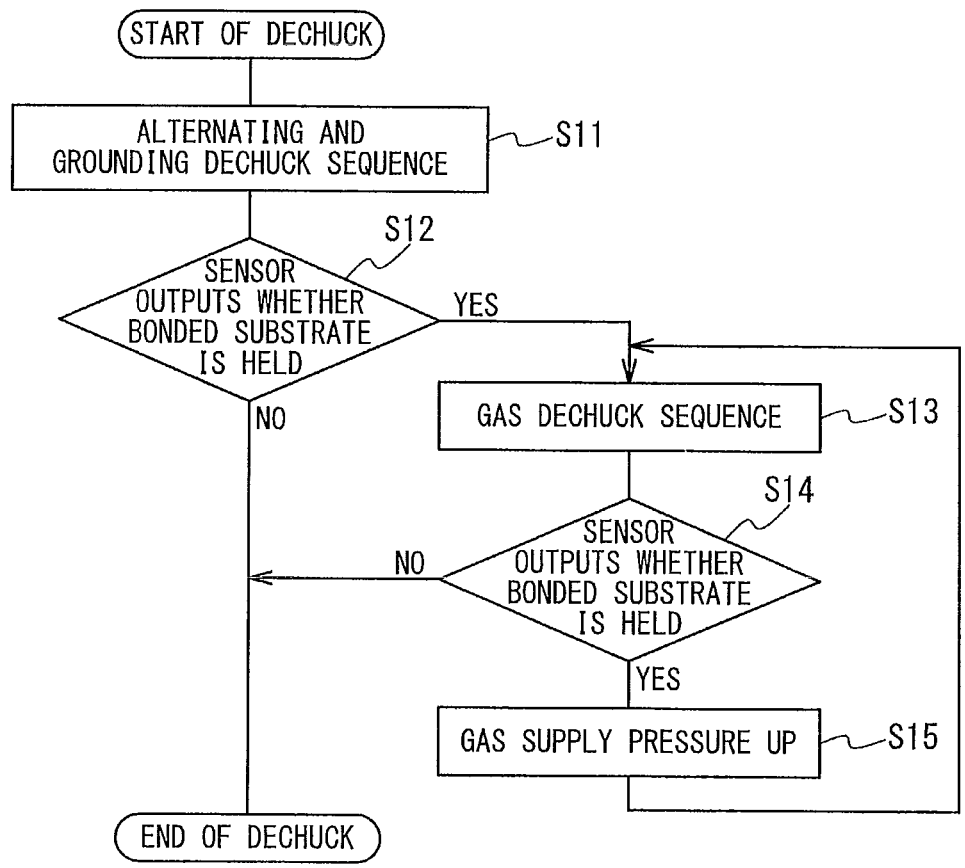
FIG. 11 is a flowchart showing a first dechuck sequence.

FIG. 11 shows the first dechuck sequence. The power supply unit 31 is firstly switched from the substrate holding mode to the alternating and attenuating mode immediately after room-temperature bonding. At this time, the voltage which attenuates while alternating is applied to the electrode 26-1, and the voltage which attenuates while alternating is applied to the electrode 26-2, while the upper holding mechanism 7 is positioned at the same position as the case of the room-temperature bonding as shown in FIG. 8. After the alternation is repeated for a given number of times, the power supply unit 31 is switched from the alternating and attenuating mode to the grounding mode. At this time, the electrode 26-1 is grounded and the electrode 26-2 is grounded as shown in FIG. 9. The pressure bonding mechanism 11 raises the upper holding mechanism 7 by 0.5 mm after the electrodes 26-1 and 26-2 are grounded (step S11).

As a result of application of the voltage which attenuates while alternating to the electrodes 26-1 and 26-2, non-uniformity of residual charges on the attracting face 23 of the electrostatic chuck 22 is removed. That is to say, the residual charges on the attracting face 23 of the electrostatic chuck 22 are removed and charges are not newly accumulated on the attracting face 23. For this reason, residual attracting force, with which the electrostatic chuck 22 holds the bonded substrate when the electrodes 26-1 and 26-2 are grounded, is lowered. It is prevented that charges remain to the bonded substrate when the bonded substrate is grounded by the lower holding mechanism 8. For this reason, the residual attracting force is further lowered. The bonded substrate is kept being held by the upper holding mechanism 7, when an absolute value of the residual attracting force is larger than an absolute value of gravity applied to the bonded substrate. When the residual attracting force is smaller than the gravity, the bonded substrate moves to the lower holding mechanism 8 due to the gravity and is held by the lower holding mechanism 8 due to the gravity.

The sensor 33 detects whether the bonded substrate is held by the electrostatic chuck 22 after the upper holding mechanism 7 is raised by 0.5 mm (step S12). The gas dechuck unit 32, when the bonded substrate is held by the electrostatic chuck 22 (step S12, YES), supplies argon gas at a relativelylow gas supply pressure, between the electrostatic chuck 22 and the bonded substrate through the gas flow passage 27 and the gas holes 24 (step S13).

The sensor 33, after supplying the argon gas between the electrostatic chuck 22 and the bonded substrate, again detects whether the bonded substrate is held by the electrostatic chuck 22 (step S14). The gas dechuck unit 32, when the bonded substrate is held by the electrostatic chuck 22 (step S14, YES) supplies argon gas between the electrostatic chuck 22 and the bonded substrate at a gas supply pressure slightly larger than the gas supply pressure of the formerly-supplied argon gas (step S15, step S13). The operations of the step S15 and the step S13 are repeated until the bonded substrate is detached from the electrostatic chuck 22.

When the bonded substrate is detached from the electrostatic chuck 22 (step S14, NO), residual attracting force is calculated. The residual attracting force f is expressed by the following expression with the use of a gas pressure p and a gas pressure applying area s.

$$f = p \times s$$

The gas pressure p indicates a gas supply pressure of argon gas supplied between electrostatic chuck 22 and the bonded substrate by the gas dechuck unit 32 when the bonded substrate is detached from the electrostatic chuck 22. The gas pressure applying area s indicates a total area of the gas holes 24, e.g. an area where the bonded substrate is in contact with argon gas supplied from the gas dechuck unit 32 when the bonded substrate is held by the electrostatic chuck 22.

The operations from the steps S13 to S15 are not performed when the bonded substrate is detached from the electrostatic chuck 22 after the step S11 is performed (step S12, NO).

According to the first dechuck sequence, the upper holding mechanism 7 can dechuck the bonded substrate more surely. That is to say, the application of the voltage which attenuates while alternating, to the electrodes 26-1 and 26-2 lowers residual attracting force with which the electrostatic chuck 22 holds the bonded substrate. For this reason, the bonded substrate can be dechucked without performing the operations of the steps S13 to S15. Even if the residual attracting force is not lowered enough, the bonded substrate can be dechucked more surely in a shorter period of time, by performing the operations of the steps S13 to S15. The gas supply pressure of the argon gas supplied in the step S13 is lowered due to the lowering of the residual attracting force. For this reason, argon gas is prevented from being excessively supplied into the bonding chamber 2.

According to the first dechuck sequence, the bonded substrate can be dechucked with smaller-pressure argon gas even if it is difficult to estimate the magnitude of the residual attracting force, and argon gas is prevented from being excessively supplied into the bonding chamber 2. According to the first dechuck sequence, it is also possible to measure attracting force with which the electrostatic chuck 22 holds the bonded substrate. The attracting force can also be used to calculate an applied voltage for the upper holding mechanism 7 to hold a substrate. Furthermore, the wafer bonding device 1 does not need to separately have a sensor (e.g. load cell) for measuring the residual attracting force.

Figure 12:
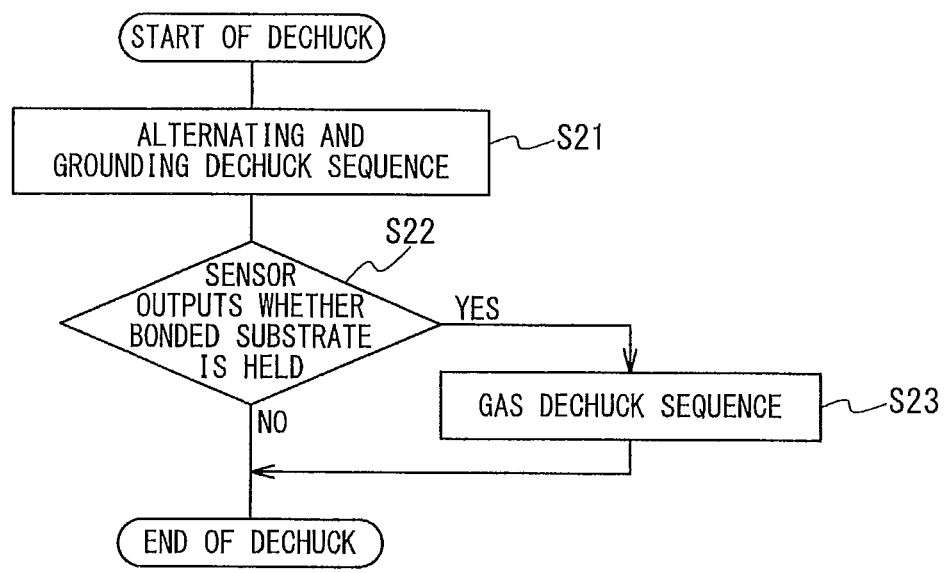
FIG. 12 is a flowchart showing a second dechuck sequence.

FIG. 12 shows the second dechuck sequence. The power supply unit 31 is firstly switched from the substrate holding mode to the alternating and attenuating mode immediately after room-temperature bonding. At this time, the voltage which attenuates while alternating is applied to the electrode 26-1 and the voltage which attenuates while alternating is applied to the electrode 26-2, while the upper holding mechanism 7 is positioned at the same position as the case of the room-temperature bonding as shown in FIG. 8. After the alternation is repeated for a given number of times, the power supply unit 31 is switched from the alternating and attenuating mode to the grounding mode. At this time, the electrode 26-1 is grounded and the electrode 26-2 is grounded as shown in FIG. 9. The pressure bonding mechanism 11 raises the upper holding mechanism 7 by 0.5 mm after the electrodes 26-1 and 26-2 are grounded (step S21).

As a result of the above operations, when the electrodes 26-1 and 26-2 are grounded, the residual attracting force, with which the electrostatic chuck 22 holds the bonded substrate, is lowered in the same way as the step S11 of FIG. 11. The bonded substrate is kept being held by the upper holding mechanism 7, when an absolute value of the residual attracting force is larger than an absolute value of gravity applied to the bonded substrate. When the residual attracting force is smaller than the gravity, the bonded substrate moves to the lower holding mechanism 8 due to the gravity and is held by the lower holding mechanism 8 due to the gravity.

The sensor 33 detects whether the bonded substrate is held by the electrostatic chuck 22 after the upper holding mechanism 7 is raised by 0.5 mm (step S22). The gas dechuck unit 32, when the bonded substrate is held by the electrostatic chuck 22 (step S22, YES), supplies argon gas at a gas supply pressure at the time of detachment of the bonded substrate from the electrostatic chuck 22 in the first dechuck sequence, between the electrostatic chuck 22 and the bonded substrate (step S23). Supply of argon gas is not performed when the bonded substrate is detached from the electrostatic chuck 22 after the step S21 is performed (step S22, NO).

According to the second dechuck sequence, the bonded substrate can be dechucked more surely and argon gas is prevented from being excessively supplied, in the same way as the first dechuck sequence. As a result, degradation of degree of vacuum inside the bonding chamber 2 is prevented. The second dechuck sequence can be performed in a shorter period of time compared with the first dechuck sequence. For this reason, the wafer bonding method according to the present invention can be performed in a shorter period of time compared with a case where the first dechuck sequence is performed each time in the step S3. Furthermore, in the wafer bonding method according to the present invention, the second dechuck sequence can be performed in the step S3 from the beginning and the first dechuck sequence does not need to be performed when a gas supply pressure for dechucking the bonded substrate is known.

Note that the power supply unit 31 can be replaced by another power supply unit which can apply a given voltage to the lower holding mechanism 8 at any timing. For example, the power supply unit, when the lower substrate is positioned to the lower holding mechanism 8, applies a fixed voltage to the lower holding mechanism 8 so that the lower holding mechanism 8 holds the lower substrate. The power supply unit, when a voltage which attenuates while alternating is applied to the upper holding mechanism 7, grounds the lower holding mechanism 8. Such a wafer bonding device can dechuck a bonded substrate more surely and can bond substrates in a shorter period of time, in the same way as the wafer bonding device 1 in the above-mentioned embodiment.

The wafer bonding device according to the present invention can further includes a mechanism for grounding a substrate through an electrode which directly comes in contact with the substrate held by the upper holding mechanism 7. The mechanism grounds the bonded substrate held by the upper holding mechanism 7 in the step S11 and the step S21. The mechanism can also ground the bonded substrate held by the upper holding mechanism 7 in the steps S13 and S15, and the step S23. Such a wafer bonding device can dechuck a bonded substrate more surely and can bond substrates in a shorter period of time by grounding the bonded substrate held by the upper holding mechanism 7 more surely, in the same way as the wafer bonding device 1 according to the above-mentioned embodiment.

Figure 13:
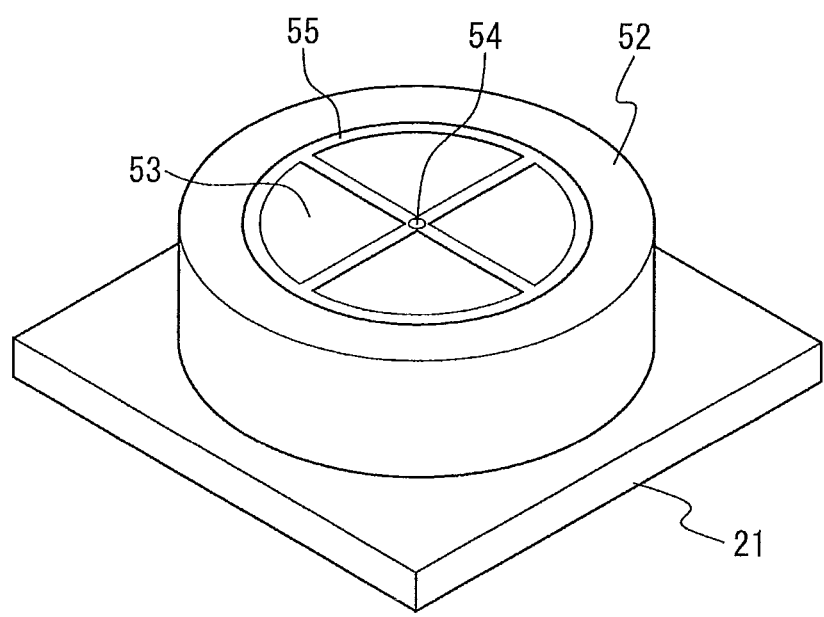
FIG. 13 is a perspective view showing another electrostatic chuck.

The electrostatic chuck 52 can be replaced by another electrostatic chuck 22. An electrostatic chuck 52 is made of ceramics, in the shape of a cylinder as shown in FIG. 13. In the electrostatic chuck 52, one bottom surface of the cylinder is bonded to the base material 21 and fixed onto the base material 21. The electrostatic chuck 52 includes an attracting face 53, a gas hole 54, and a groove 55. The attracting face 53, which is the other bottom surface of the cylinder, is formed as a flat and smooth surface. The gas hole 54 is formed into the attracting face 53. The groove 55 is formed so that the groove 55 is connected to the gas hole 54 and so that the groove 55 is widely positioned onto a region where the attracting face 53 and a substrate come into contact with each other in the attracting face 53.

The above electrostatic chuck 52 is effective in that a held substrate is detached more surely, in the same way as the electrostatic chuck 22 according to the above-mentioned embodiment. The above electrostatic chuck 52 is preferable when scattered placement of a plurality of gas holes 24 as in the case of the electrostatic chuck 22 is not possible.

Note that the electrostatic chuck 22 may include another unit which mechanically detaches a substrate held by the electrostatic chuck 22 from the electrostatic chuck 22. The unit is exemplified by a movable pin which mechanically detaches a substrate from the electrostatic chuck 22. Such a wafer bonding device can detach a substrate from the electrostatic chuck 22 more surely, in the same way as the above-mentioned embodiment. Such a wafer bonding device is preferable since the wafer bonding device does not need the gas holes 24 and the flow passage 27 provided to the electrostatic chuck 22 nor the gas dechuck unit 33.

The wafer bonding device and the wafer bonding method according to the present invention can lower residual attracting force with which a holding mechanism holds a substrate by applying voltage which attenuates while alternating to the holding mechanism, and dechuck the substrate from the holding mechanism more surely in a shorter period of time. As a result, the wafer bonding device and the wafer bonding method according to the present invention can bond substrates in a shorter period of time.

The invention claimed is:

1. A wafer bonding method comprising:
holding a first substrate with a holding mechanism by applying a voltage to said holding mechanism, said holding mechanism being arranged on an upper side of an inside of a chamber;
holding a second substrate with another holding mechanism, said another holding mechanism being arranged on a lower side of said inside of said chamber;
generating a bonded substrate by bonding said first substrate and said second substrate;
dechucking said bonded substrate from said holding mechanism after a voltage which attenuates while alternating is applied to said holding mechanism;
raising said holding mechanism; and
supplying gas between said bonded substrate and said holding mechanism such that the bonded substrate held by said raised holding mechanism falls on said another holding mechanism;
wherein said gas is supplied between said bonded substrate and said raised holding mechanism when said bonded substrate is not dechucked from said holding mechanism and said bonded substrate is not in contact with another holding mechanism,
wherein said gas is not supplied between said bonded substrate and said raised holding mechanism when said bonded substrate is dechucked from said holding mechanism.

2. The wafer bonding method according to claim 1, wherein said bonded substrate, when dechucked from said holding mechanism, moves so that said bonded substrate is held by said another holding mechanism with gravity applied to said bonded substrate.

3. The wafer bonding method according to claim 2, further comprising:
detecting whether said bonded substrate is dechucked from said holding mechanism; and
supplying gas with a pressure greater than a pressure of said gas between said bonded substrate and said holding mechanism when said bonded substrate is not dechucked from said holding mechanism.

4. The wafer bonding method according to claim 3, further comprising:
separating said holding mechanism and said another holding mechanism when said another holding mechanism holds said bonded substrate; and
carrying said bonded substrate after said holding mechanism and said another holding mechanism are separated.

5. The wafer bonding method according to claim 4, further comprising:
holding a third substrate different from said first substrate with said holding mechanism;
generating another bonded substrate by bonding said third substrate and a fourth substrate; and
supplying gas with said pressure of said gas supplied between said holding mechanism and said bonded substrate when said bonded substrate is dechucked from said holding mechanism after a voltage which attenuates while alternating is applied to said holding mechanism, between said other bonded substrate and said holding mechanism.

6. The wafer bonding method according to claim 4, further comprising:
calculating attracting force with which said holding mechanism holds said bonded substrate, based on said pressure of said gas supplied between said holding mechanism and said bonded substrate when said bonded substrate is dechucked from said holding mechanism.

7. The wafer bonding method according to claim 1, further comprising:
grounding said bonded substrate after said voltage which attenuates while alternating is applied to said holding mechanism.

8. The wafer bonding method according to claim 7, further comprising:
cleaning said first substrate and said second substrate before said first substrate and said second substrate are bonded.

* * * * *